United States Patent
Park et al.

(10) Patent No.: US 10,832,966 B2
(45) Date of Patent: Nov. 10, 2020

(54) METHODS AND STRUCTURES FOR A GATE CUT

(71) Applicant: GLOBALFOUNDRIES Inc., Grand Cayman (KY)

(72) Inventors: Chang Seo Park, Clifton Park, NY (US); Haiting Wang, Clifton Park, NY (US); Shimpei Yamaguchi, Ballston Lake, NY (US); Junsic Hong, Malta, NY (US); Yong Mo Yang, Clifton Park, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 17 days.

(21) Appl. No.: 15/899,986

(22) Filed: Feb. 20, 2018

(65) Prior Publication Data
US 2019/0259668 A1    Aug. 22, 2019

(51) Int. Cl.
*H01L 27/115* (2017.01)
*H01L 21/8234* (2006.01)
*H01L 27/088* (2006.01)
*H01L 29/66* (2006.01)

(52) U.S. Cl.
CPC ........ *H01L 21/823481* (2013.01); *H01L 21/823456* (2013.01); *H01L 21/823468* (2013.01); *H01L 27/088* (2013.01); *H01L 21/823437* (2013.01); *H01L 29/6653* (2013.01); *H01L 29/66545* (2013.01)

(58) Field of Classification Search
CPC ..... H01L 21/823481; H01L 21/823456; H01L 21/823468; H01L 27/088; H01L 29/6653; H01L 29/66545

USPC .......................................................... 257/395
See application file for complete search history.

(56) References Cited

U.S. PATENT DOCUMENTS

| | | | |
|---|---|---|---|
| 7,564,105 B2 | 7/2009 | Chi et al. | |
| 8,003,466 B2 | 8/2011 | Shi et al. | |
| 9,761,495 B1 | 9/2017 | Xie et al. | |
| 2008/0135888 A1 | 6/2008 | Lee et al. | |
| 2010/0295112 A1* | 11/2010 | Izumida | H01L 27/11521 257/316 |
| 2013/0309838 A1* | 11/2013 | Wei | H01L 21/76229 438/424 |
| 2017/0084463 A1 | 3/2017 | Greene et al. | |
| 2017/0148682 A1 | 5/2017 | Basker et al. | |
| 2018/0286952 A1* | 10/2018 | Abiko | H01L 29/66712 |

\* cited by examiner

*Primary Examiner* — Hrayr A Sayadian
(74) *Attorney, Agent, or Firm* — Thompson Hine LLP; Francois Pagette

(57) ABSTRACT

Structures and fabrication methods for a field-effect transistor. First and second spacers are formed adjacent to opposite sidewalls of a gate structure. A section of the gate structure is partially removed with a first etching process to form a cut that extends partially through the gate structure. After partially removing the section of the gate structure with the first etching process, upper sections of the first and second sidewall spacers arranged above the gate structure inside the cut are at least partially removed. After at least partially removing the upper sections of the first and second sidewall spacers, the section of the gate structure is completely removed from the cut with a second etching process. A dielectric material is deposited inside the cut to form a dielectric pillar.

11 Claims, 4 Drawing Sheets

METHODS AND STRUCTURES FOR A GATE CUT

BACKGROUND

The invention relates generally to semiconductor device and integrated circuit fabrication and, in particular, to structures and fabrication methods relating to a field-effect transistor.

Device structures for a field-effect transistor generally include a source region, a drain region, and a gate electrode configured to switch carrier flow in a channel formed in a body region. When a control voltage exceeding a designated threshold voltage is applied to the gate electrode, carrier flow occurs in the channel between the source and drain regions to produce a device output current. The body region of a planar field-effect transistor is located beneath the top surface of a substrate on which the gate electrode is supported.

Replacement gate technologies often form sacrificial gate structures that are present for a portion of the front-end-of-line process and that are eventually removed and replaced by functional gate structures. The sacrificial gate structures may be cut to generate disconnected sections, which are replicated as disconnected sections of functional gate structures in the final construction of the device structure. A dielectric material is applied to fill the cut and provide electrical isolation between the disconnected sections of the functional gate structures. As the critical dimension of the sacrificial gate structures shrinks, the ability to completely remove the sacrificial gate structure at the location of cut increases in difficulty. A consequence of incomplete removal of the sacrificial gate structure from the cut may be an electrical short between the functional gate structures on opposite sides of the cut.

SUMMARY

In an embodiment of the invention, a method includes forming first and second spacers adjacent to opposite sidewalls of a gate structure, and patterning a section of the gate structure with a first etching process to form a cut that extends partially through the gate structure. After patterning the section of the gate structure with the first etching process, upper sections of the first and second sidewall spacers arranged above the gate structure inside the cut are at least partially removed. After at least partially removing the upper sections of the first and second sidewall spacers, the section of the gate structure is completely removed from the cut with a second etching process. A dielectric material is deposited inside the cut to form a dielectric pillar.

In an embodiment of the invention, a structure includes a first gate structure and a second gate structure spaced from the first dielectric spacer by a cut. A dielectric pillar is arranged in the cut between the first gate structure and the second gate structure. The dielectric pillar has a lower section and an upper section that is wider than the lower section.

In an embodiment of the invention, a structure includes a first gate structure and a second gate structure spaced from the first gate structure by a cut, and a dielectric pillar arranged in the cut between the first gate structure and the second gate structure. The structure further includes a first sidewall spacer and a second sidewall spacer separated from the first sidewall spacer inside the cut by the dielectric pillar, the first gate structure, and the second gate structure. The first sidewall spacer is separated from the first sidewall spacer outside the cut by the first gate structure and the second gate structure. The first sidewall spacer and the second sidewall spacer have a first height inside the cut and a second height outside of the cut. The first height is less than the second height.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 8 is a top view in which FIG. 7 is taken generally along line 7-7.

DETAILED DESCRIPTION

Figure 1:
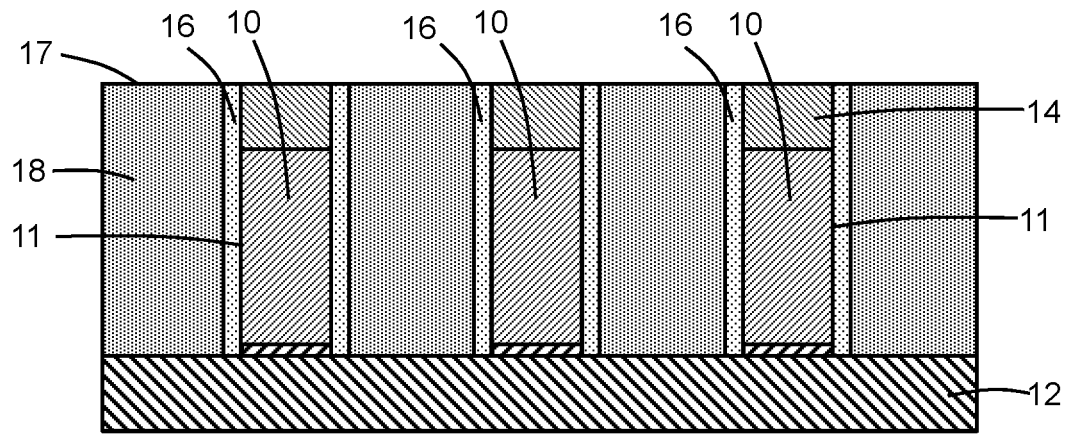
FIG. 1 is a cross-sectional view of device structure at an initial fabrication stage of a processing method in accordance with embodiments of the invention.

With reference to FIG. 1 and in accordance with embodiments of the invention, a device structure includes sacrificial gate structures 10 that are arranged over a substrate 12. The sacrificial gate structures 10 may be a set of lines that are parallel and that are formed at a given pitch. The substrate 12 may be a bulk single-crystal wafer composed of silicon, a silicon device layer of a silicon-on-insulator (SOI) wafer, a semiconductor fin, etc. and may include trench isolation (not shown). The sacrificial gate structures 10 are placeholder structures for functional gate structures that are formed in a subsequent processing stage. The sacrificial gate structures 10 may be formed by depositing a thin dielectric layer, such as silicon dioxide ($SiO_2$) by atomic layer deposition (ALD), and then a blanket layer of a sacrificial material, such as amorphous silicon or polysilicon by chemical vapor deposition (CVD), and patterning these layers using sections of a hardmask as an etch mask and an anisotropic etching process. The sacrificial gate structures 10 may be covered by caps 14 representing the hardmask sections that remain after patterning.

Sidewall spacers 16 are arranged adjacent to the sidewalls 11 of each sacrificial gate structure 10. The sidewall spacers 16 may be composed of a dielectric material, such as a low-k dielectric material having a dielectric constant (i.e., permittivity) less than the dielectric constant of silicon nitride ($Si_3N_4$). Low-k dielectric materials suitable for the sidewall spacers 16 include, but are not limited to, silicon oxycarbonitride (SiOCN), deposited as a conformal layer by atomic layer deposition (ALD) and etched with a directional etching process, such as reactive ion etching (RIE).

An interlayer dielectric layer 18 is formed with sections that fill the gaps adjacent to and between the sacrificial gate structures 10 and their associated sidewall spacers 16. The interlayer dielectric layer 18 may be composed of a dielectric material, such as silicon dioxide ($SiO_2$) deposited by a flowable chemical vapor deposition (FCVD) process and planarized by chemical mechanical polishing (CMP) to have a top surface 17 that is coplanar with the top surface of the caps 14.

Figure 2:
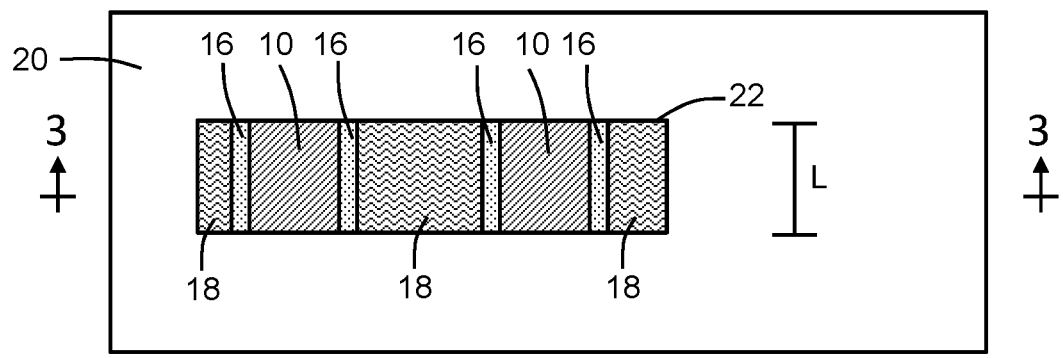
FIG. 2 is a top view of device structure of FIG. 1 at a subsequent fabrication stage of the processing method.
Figure 3:
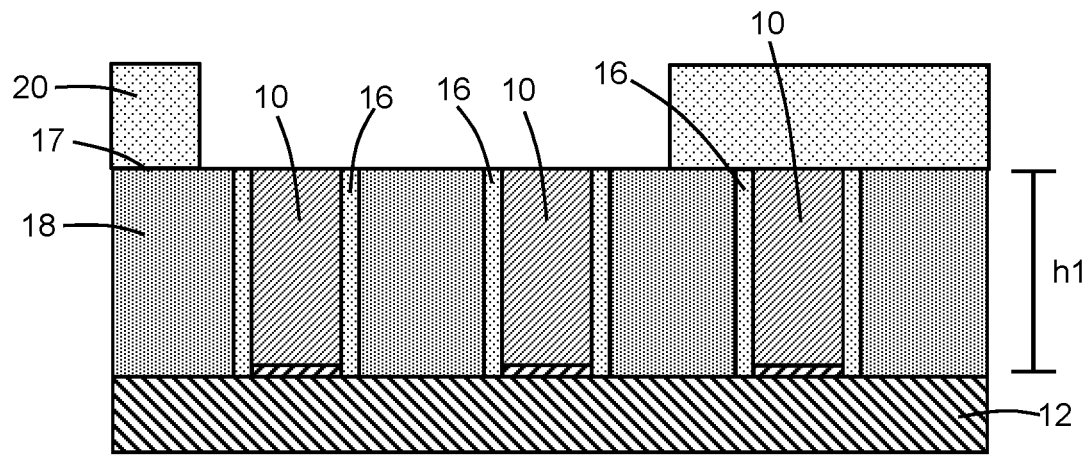
FIG. 3 is a cross-sectional view taken generally along line 3-3 in FIG. 2.

With reference to FIGS. 2, 3 in which like reference numerals refer to like features in FIG. 1 and at a subsequent fabrication stage, the caps 14 are removed selective to the interlayer dielectric layer 18 and the sidewall spacers 16, as well as the sacrificial gate structures 10, and the interlayer dielectric layer 18 may be planarized by chemical mechanical polishing (CMP). The top surfaces of the sacrificial gate structures 10 are revealed by the planarization and may be coplanar with the top surface 17 of the interlayer dielectric layer 18. The sacrificial gate structures 10 and the sidewall spacers 16 have a height, h1, relative to a top surface of the substrate 12 at the conclusion of this fabrication stage.

An etch mask 20 is applied over the interlayer dielectric layer 18 and patterned using a lithography and etching process to form an opening 22, which may have the shape of a slot. The etch mask 20 may be comprised of a layer of a light-sensitive material, such as an organic photoresist, applied by a spin coating process, pre-baked, exposed to light projected through a photomask, baked after exposure, and developed with a chemical developer. The etch mask 20 may also include a spin-on hardmask, such as an organic planarization layer (OPL), applied by spin coating and patterned using the patterned photoresist. The opening 22 overlaps with sections of the sacrificial gate structures 10 that are to be cut. Other sections of the sacrificial gate structures 10, including sections adjacent to the opening 22, are covered by the etch mask 20.

Figure 4:
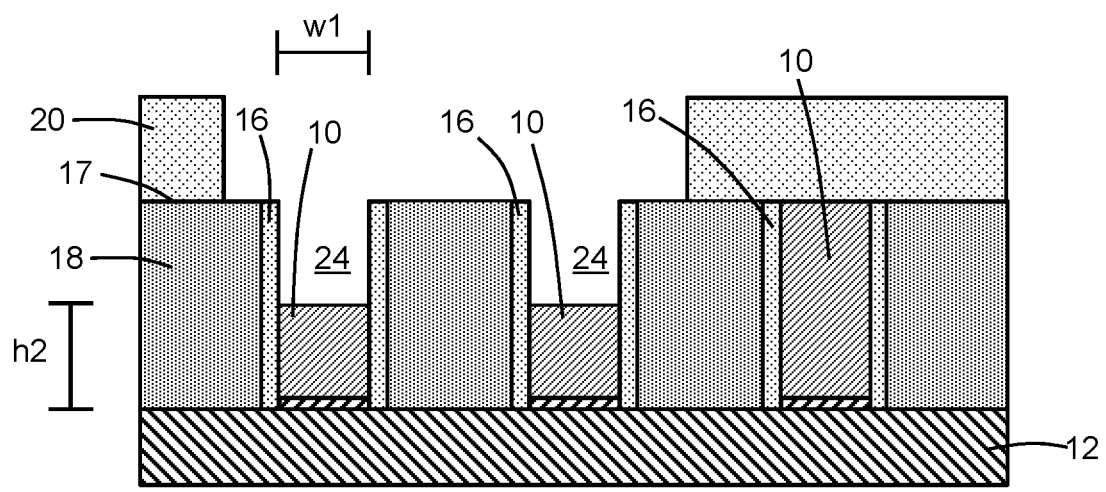
FIGS. 4 and 5 are cross-sectional views of the device structure at successive fabrication stages subsequent to FIG. 2.

With reference to FIG. 4 in which like reference numerals refer to like features in FIG. 3 and at a subsequent fabrication stage, upper sections of the sacrificial gate structures 10 are removed inside the boundary of the opening 22 in the etch mask 20 present using an etching process. The etching process removes the material of the sacrificial gate structures 10 inside the opening 22 selective to the materials of the sidewall spacers 16 and interlayer dielectric layer 18. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The etching process may be a reactive ion etching (ME) process that uses a mixture of carbon and fluorine as etchant species generated from carbon tetrafluoride ($CF_4$).

The removal of the upper sections of the sacrificial gate structures 10 opens cuts or cavities 24 that are arranged above the respective lower sections of the sacrificial gate structures 10 and between the sidewall spacers 16. Upper sections of the sidewall spacers 16 are arranged between the top surface 17 of the interlayer dielectric layer 18 and the lower sections of the recessed sacrificial gate structures 10. These upper sections of the sidewall spacers 16 are exposed inside the boundary of the opening 22 in the etch mask 20 at the sidewalls of the cavities 24. Each cavity 24 has a width, w1, measured as a distance between the sidewall spacers 16, and that is equal in dimensions to the width of the sacrificial gate structure 10.

Portions of the sacrificial gate structures 10 that are covered by the etch mask 20 are not etched and removed, and remain intact so as to retain the original height (FIG. 3). The lower sections of the sacrificial gate structures 10, which result from recessing the sacrificial gate structures 10 with the boundary of the opening 22 in the etch mask 20, have a height, h2, at the conclusion of this fabrication stage that is less than the original height (FIG. 3). In an embodiment, the height of the remaining lower sections of the sacrificial gate structures 10 may be one-half of the original height. In a lengthwise direction, a notch is defined in each of the sacrificial gate structures 10 overlapping with the location of the opening 22 in the etch mask 20.

Figure 5:
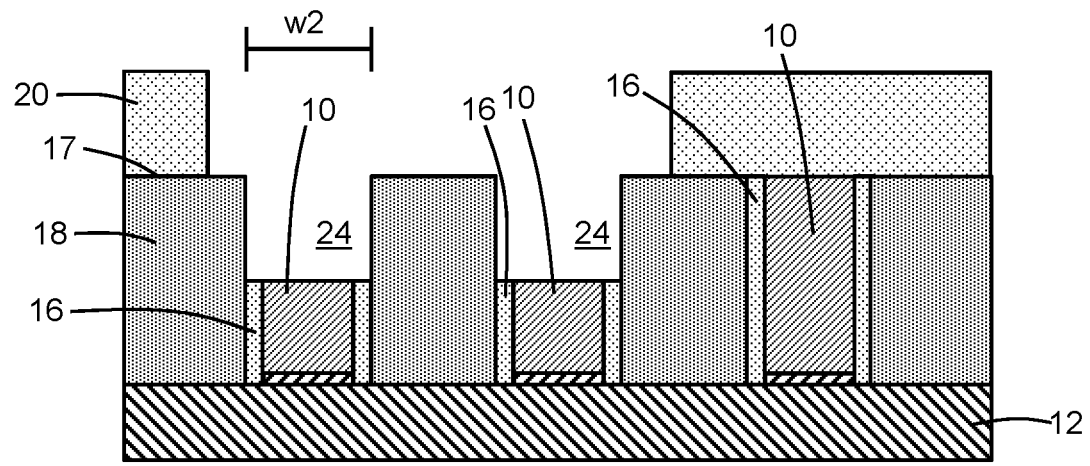

With reference to FIG. 5 in which like reference numerals refer to like features in FIG. 4 and at a subsequent fabrication stage, the upper sections of the sidewall spacers 16 arranged above the recessed top surface of the sacrificial gate structures 10 within the boundary of the opening 22 in the etch mask 20 are removed using an etching process. The etching process removes the material of the sidewall spacers 16 selective to the materials of the sacrificial gate structures 10 and interlayer dielectric layer 18. Portions of the sidewall spacers 16 that are covered by the etch mask 20 are not etched and removed, and remain intact so as to retain the original height (FIG. 3).

The removal of the upper sections of the sidewall spacers 16 operates to widen the cavities 24 above the remaining lower sections of the sacrificial gate structures 10 and horizontally between the sidewall spacers 16. Each widened cavity 24 has a width, w2, measured as a distance between the interlayer dielectric layer 18 at opposite sides of the cavity 24, and that is equal in dimensions to the aggregate width of the sacrificial gate structure 10 and sidewall spacers 16. The removal of the upper sections of the sidewall spacers 16 defines a notch in the sidewall spacers 16 at the location of the cut in the sacrificial gate structures 10. In a lengthwise direction, a notch is defined in each of the sidewall spacers 16 overlapping with the location of the opening 22 in the etch mask 20.

Figure 5A:
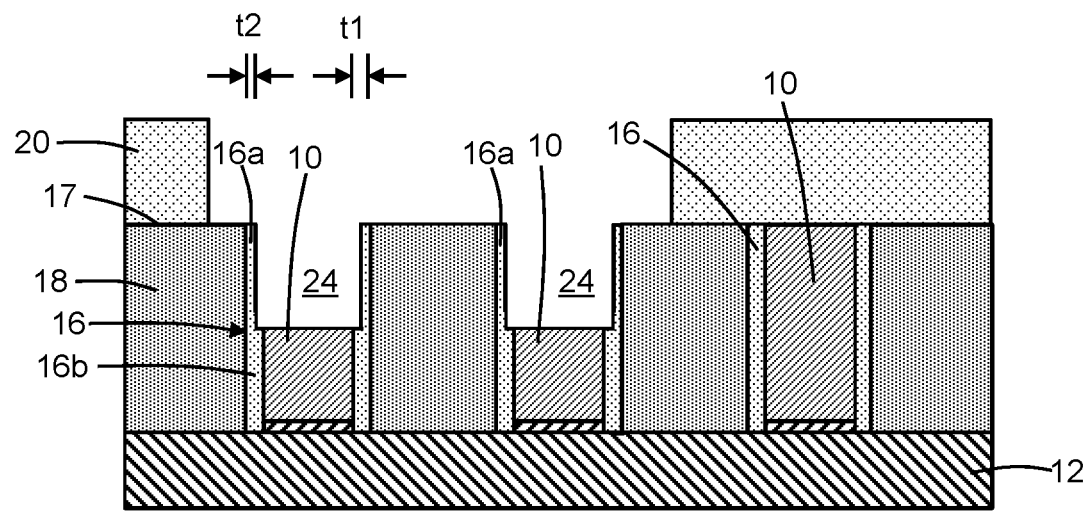
FIG. 5A is a cross-sectional view similar to FIG. 5 in accordance with alternative embodiments of the invention.

In an alternative embodiment and as shown in FIG. 5A, the upper sections 16a of the sidewall spacers 16 may be partially removed inside the boundary of the opening 22 in the etch mask 20 using an etching process, such as an isotropic etching process. The upper sections 16a of the sidewall spacers 16 have a thickness, t1, and the lower sections 16b of the sidewall spacers 16 have a thickness, t2, that is greater than the thickness, t1. The partial removal thins the upper sections 16a of the sidewall spacers 16 to provide a thickness reduction, and also operates to widen the cavities 24 above the lower sections of the partially-removed sacrificial gate structures 10 and between the sidewall spacers 16.

Figure 6:
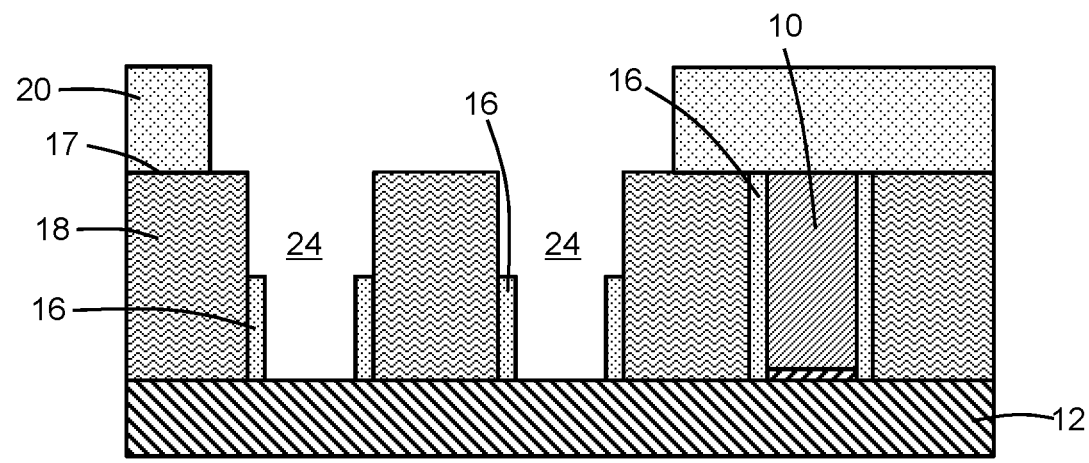
FIGS. 6 and 7 are cross-sectional views of the device structure at successive fabrication stages subsequent to FIG. 5.
Figure 8:
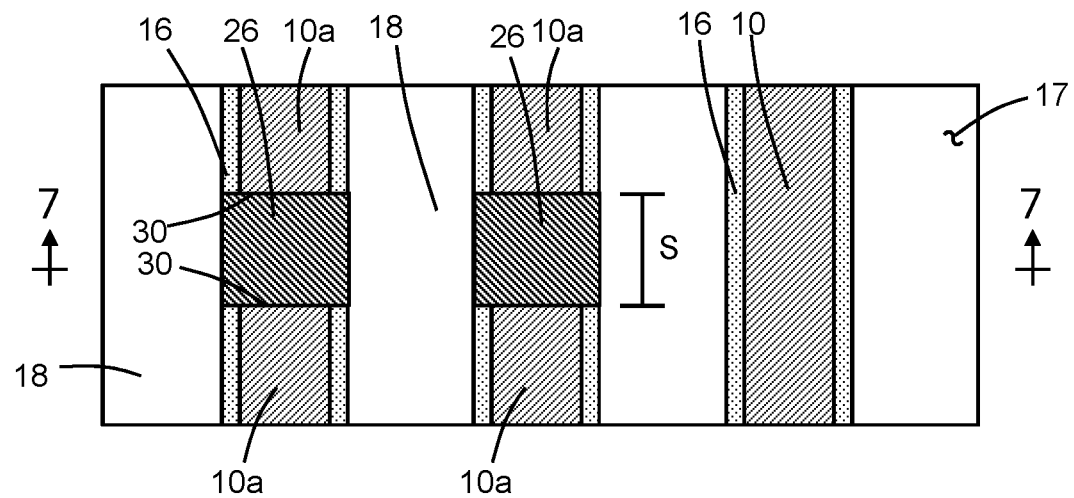

With reference to FIG. 6 in which like reference numerals refer to like features in FIG. 5 and at a subsequent fabrication stage, the lower sections of the sacrificial gate structures 10 inside the boundary of the opening 22 in the etch mask 20 are removed using an etching process with the etch mask 20 present. The etching process removes the material of the sacrificial gate structures 10 selective to the materials of the sidewall spacers 16 and interlayer dielectric layer 18, and may include an overetch to ensure complete removal of the materials of the sacrificial gate structures 10. The removal of the lower sections of the sacrificial gate structures 10 extends the cavities 24 to the top surface of the substrate 12. Lower sections of the sidewall spacers 16 are exposed at the sides of the lower portion of the cavities 24. The cut sacrificial gate structures 10 are each divided into a respective pair of shorter sacrificial gate structures 10a that have respective ends 30 separated by a tip-to-tip spacing, as best shown in FIG. 8. The tip-to-tip spacing between the ends 30 is equal to the length of the opening 22 in the etch mask 20 (FIG. 2).

Each of the cavities 24 has multiple sections of different widths. The upper section of each cavity 24 has a width, w2, that is increased because of the removal of the upper sections of the sidewall spacers 16. The lower section of each cavity 24 has a width, w1, that is less than the width, w2, of the overlying upper section. The lower section of each cavity 24 is surrounded by the lower sections of the sidewall spacers 16.

In terms of the etching process sequence, the removal of the sacrificial gate structures 10 within the boundary of the opening 22 in the etch mask 20 is paused after the initial etching process to permit the removal of the upper sections of the sidewall spacers 16. After the directly related widening of the upper section of the cavities 24 from the removal of the upper sections of the sidewall spacers 16, the etching process is resumed to remove the lower sections of the sacrificial gate structures 10.

Figure 7:
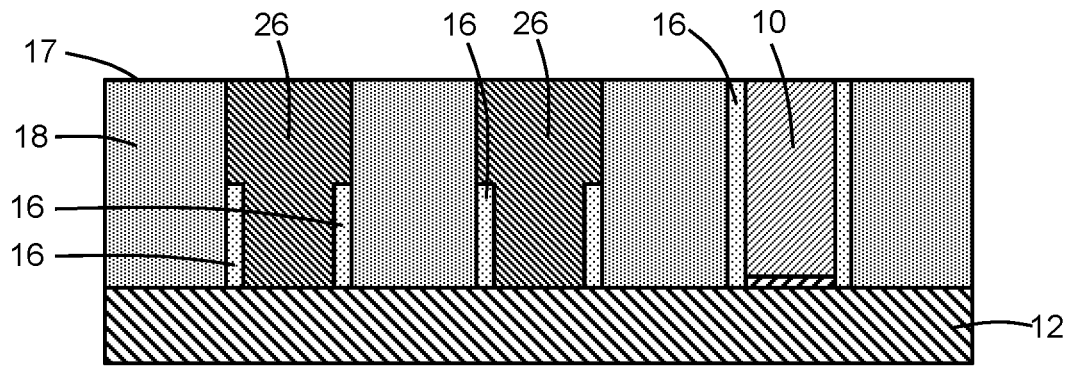

With reference to FIGS. 7, 8 in which like reference numerals refer to like features in FIG. 6 and at a subsequent fabrication stage, the etch mask 20 may be removed, and dielectric pillars 26 are formed in the cavities 24 and adopt the shape of the cavities 24 to have an upper portion that is wider than the lower portion between the sidewall spacers 16. The dielectric pillars 26 may be composed of a dielectric material, such as silicon nitride ($Si_3N_4$), formed by chemical vapor deposition (CVD) and planarized by chemical mechanical polishing (CMP) to be coplanar with the top surface 17 of the interlayer dielectric layer 18.

The dielectric pillars 26 conform to the dual-width shape of the cavities 24 such that an upper portion has the width, w2, and the lower portion has the width, w1. Each dielectric pillar 26 is arranged between one of the pairs of shorter sacrificial gate structures 10a, which have respective ends 30 separated by a tip-to-tip spacing, S, that is equal to the length of the opening 22 in the etch mask 20 (FIG. 2). Each dielectric pillar 26 has a length in a direction perpendicular to the widths that is equal to the dimension of the tip-to-tip spacing between the ends 30.

Figure 9:
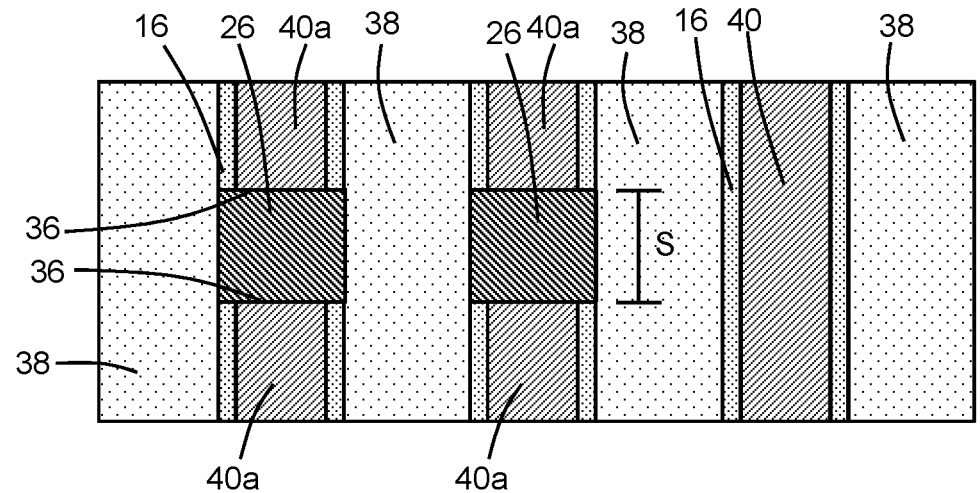
FIG. 9 is a top view of the device structure at a fabrication state subsequent to FIG. 8.

With reference to FIG. 9 in which like reference numerals refer to like features in FIG. 8 and at a subsequent fabrication stage, processing continues to complete the field-effect transistors, including the formation of source/drain regions 38 and functional gate structures 40, 40a. The sacrificial gate structures 10, 10a are pulled and removed using an etching process that is selective to the materials of the sidewall spacers 16, the interlayer dielectric layer 18, and the dielectric pillars 26, and replaced by the functional gate structures 40. The dielectric pillars 26, which provide dielectric-filled cuts between the sacrificial gate structures 10a, also provide dielectric filled cuts of equivalent dimensions in the functional gate structures 40a. Similar to the spatial relationship between the dielectric pillars 26 and the pairs of linearly-arranged sacrificial gate structures 10a, the ends 36 of each pair of the linearly-arranged functional gate structures 40a are separated by one of the dielectric pillars 26.

The complete removal of the sacrificial gate structures 10 inside the cavities 24, which includes multiple etching processes interrupted by modification of the sidewall spacers 16 to increase the width of an upper section of the partially-formed cavities 24, reduces the likelihood of an electrical short occurring between the functional gate structures on opposite sides of the cut. The widening of the critical dimension of the upper section of the cavities 24 inside the cuts may also mitigate polymer pinch-off and reduce the unwanted accumulation of silicon residues.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first gate structure;
   a second gate structure spaced from the first gate structure by a cut; and
   a dielectric pillar arranged in the cut between the first gate structure and the second gate structure, the dielectric pillar having a lower section and an upper section that is wider than the lower section,
   wherein the first gate structure is linearly aligned with the second gate structure, the first gate structure has a first end, the second gate structure has a second end, and the cut has a length equal to a tip-to-tip spacing between the first end of the first gate structure and the second end of the second gate structure.

2. A structure comprising:
   a first gate structure;
   a second gate structure spaced from the first gate structure by a cut; and a dielectric pillar arranged in the cut between the first gate structure and the second gate structure, the dielectric pillar having a lower section and an upper section that is wider than the lower section;
a first sidewall spacer; and
a second sidewall spacer that is separated from the first sidewall spacer by the lower section of the dielectric pillar, the first gate structure, and the second gate structure.

3. The structure of claim 2 further comprising:
an interlayer dielectric layer,
wherein the first sidewall spacer, the second sidewall spacer, the dielectric pillar, the first gate structure, and the second gate structure are embedded in the interlayer dielectric layer.

4. The structure of claim 3 wherein the interlayer dielectric layer is composed of a first dielectric material, and the first sidewall spacer and the second sidewall spacer are composed of a second dielectric material that can be selectively removed relative to the first dielectric material.

5. The structure of claim 2 wherein the first sidewall spacer and the second sidewall spacer have a first height inside the cut and a second height outside the cut, and the first height is less than the second height.

6. The structure of claim 2 wherein the upper section of the dielectric pillar is arranged over the first sidewall spacer and the second sidewall spacer.

7. The structure of claim 2 wherein the first sidewall spacer and the second sidewall spacer have a first thickness adjacent to the lower section of the dielectric pillar and a second thickness adjacent to the upper section of the dielectric pillar, and the second thickness is less than the first thickness.

8. The structure of claim 2 wherein the first gate structure is linearly aligned with the second gate structure, the first gate structure has a first end, the second gate structure has a second end, and the cut has a length equal to a tip-to-tip spacing between the first end of the first gate structure and the second end of the second gate structure.

9. The structure of claim 8 wherein the dielectric pillar has a length that is equal to the tip-to-tip spacing.

10. The structure of claim 2 wherein the sidewall spacers are comprised of a low-k dielectric material and the dielectric pillar is comprised of silicon nitride.

11. The structure of claim 1 wherein the sidewall spacers are comprised of a low-k dielectric material and the dielectric pillar is comprised of silicon nitride.

* * * * *